US005812012A

United States Patent [19]

Jebens

[11] Patent Number: 5,812,012

[45] Date of Patent: Sep. 22, 1998

[54] HIGH EFFICIENCY RESONANT NETWORK DRIVE FOR AN INFRARED LED

[75] Inventor: Robert W. Jebens, Skillman, N.J.

[73] Assignee: Lucent Technologies Inc., Murray Hill, N.J.

[21] Appl. No.: 762,552

[22] Filed: Dec. 9, 1996

[51] Int. Cl.[6] .......... H01L 35/00

[52] U.S. Cl. .......... 327/514; 327/291; 327/304

[58] Field of Search .......... 327/291, 300, 327/304, 514, 515

[56] References Cited

U.S. PATENT DOCUMENTS 4,654,606 3/1987 Lehmann et al. .......... 327/291
5,559,463 9/1996 Denker et al. .......... 327/300

*Primary Examiner*—Timothy P. Callahan
*Assistant Examiner*—Jeffrey Zweizig

[57] ABSTRACT

A high efficiency resonant impedance transforming network for driving a high efficiency infrared LED and the associated method for decreasing the rise time and fall time of the LED to enable the LED to operate at higher frequencies than would ordinarily be possible. The resonant impedance transforming network includes an inductively coupled circuit that contains a primary winding and a secondary winding. The LED and at least one capacitor are coupled in parallel to the secondary winding of the transformer. The secondary winding charges the capacitors connected to it. During the rise time of the LED, the charge stored in the capacitors is discharged to the LED. The discharged charge supplements the current supplied by the secondary winding and the LED experiences a current spike during its rise time that significantly shortens the duration of the rise time. As the LED is conducting a space charge is contained within the LED. During the fall time of the LED, the space charge is actively recovered and stored, thereby significantly reducing the duration of the fall time and improving efficiency.

20 Claims, 5 Drawing Sheets

HIGH EFFICIENCY RESONANT NETWORK DRIVE FOR AN INFRARED LED

CROSS REFERENCES TO RELATED APPLICATIONS

This application is related to U.S. patent applications Ser. No. 08/762,553, entitled "Self Adjusting Tuned Resonant Photodiode Input Circuit" filed on Dec. 6, 1996, Ser. No. 08/723,732, entitled "Optical Arrangement For Full Duplex Free Space Infrared Transmission" filed on Sep. 30, 1996, and Ser. No. 08/736,700, entitled "Wide-Band Tuned Input Circuit For Infrared receivers" filed on Oct. 28, 1996, having a common assignee and a common inventor.

FIELD OF THE INVENTION

The present invention relates to resonant impedance transforming networks. More particularly, the present invention relates to high efficiency resonant impedance transforming networks used to drive an LED.

BACKGROUND OF THE INVENTION

Portable infrared light sources are used in many varied applications, such as in the infrared illumination of objects viewed with a night vision device. However, one of the most common uses of infrared light transmitters is in the field of short distance wireless communications. Portable infrared communication systems are used in a wide variety of products where data is to be transmitted from one device to another across relatively short distances. For example, portable infrared communication technologies are commonly used in television remote control modules, cordless headsets and point-to-point computer links. Most portable infrared communication systems require either a direct transmission of an infrared signal beam to a receiver, such as with a television remote control, or an indirect transmission where light is indirectly received as reflected energy, such as with many cordless headsets. Both methods of transmission traditionally require a significant amount of power. In the prior art, an infrared transmitter typically uses a plurality of serially connected LEDs to provide the infrared signal being transmitted. The LEDs commonly used in such prior art devices typically have a power-to-light conversion efficiency of less than ten percent. However, such traditional low efficiency LEDs typically have relatively fast rise times and fall times that enable the LEDs to be operated at relatively high frequencies. Traditional LEDs are also commonly driven by drive circuits that are also fairly low in efficiency, thereby resulting in IR transmission circuits that have an overall power-to-light conversion efficiency of only three or four percent.

In stationary applications where 110 volts of AC power is readily available, a three or four percent conversion efficiency does not present a significant problem. However, in portable applications where only small commercial batteries power the transmitter, conversion efficiencies of only three or four percent are a major concern that effects the life of the batteries as well as the range at which the IR signal can be transmitted.

In order to provide enough operating power, many portable infrared communication devices are designed to operate on at least three commercial 1.5 volt batteries, thereby providing at least 4.5 volts for use. The reason 4.5 volts is commonly used is that if the portable infrared communication device contains two serially connected low efficiency LEDs and a current limited switch, the drive efficiency of the circuit is typically about sixty percent. Two batteries that provide only three volts could not be used because the voltage drop across two low efficiency LEDs is typically 2.7 volts. As battery voltage drops with use and age, the switch voltage from only two batteries could easily drop below the required 2.7 volts and the batteries would no longer drive the two LEDs. Commercially available 1.5 volt batteries with current ratings adequate to drive low efficiency LEDs are fairly large. In many portable infrared communication devices, size and weight are great concerns, as is the cost of operation. Consequently, in many portable infrared communication devices, just three 1.5 volt batteries are used as the power supply. The use of only three batteries provides a relatively short operational life of the device, but minimizes battery replacement costs, size constraints and weight.

LEDs with power-to-light efficiencies of greater than ten percent are available in the prior art. However, such higher efficiency LEDs are not commonly used in infrared communication devices because the slow rise time and fall times of many such LEDs require an operating frequency far below that typically used in portable infrared communication devices. As such attempts to improve the performance of portable infrared transmitters have typically contained traditional low efficiency LEDs.

Therefore, there is a need to provide a portable infrared transmitter containing a high efficiency LED and a high efficiency LED drive circuit, thereby enabling the transmitter to have improved range and battery life capacity.

There is also a need to provide a portable infrared transmitter with an LED drive capable of operating from a power source of three volts or lower and containing a reduced sensitivity to battery voltage drop.

SUMMARY OF THE INVENTION

The present invention is a high efficiency resonant impedance transforming network for driving a high efficiency infrared LED and the associated method for decreasing the rise time and fall time of the LED to enable the LED to operate at higher frequencies than would ordinarily be possible. The resonant impedance transforming network contains an inductively coupled circuit that has a primary winding and a secondary winding. The LED and at least one capacitor are coupled to the secondary winding of the inductively coupled circuit. The secondary winding charges the capacitors connected to it. During the rise time of the LED, the charge stored in the capacitors is discharged to the LED. The discharged charge supplements the current supplied by the secondary winding and the LED experiences a current spike during its rise time that significantly shortens the duration of the rise time. As the LED is emitting light, a space charge is contained within the LED. During the fall time of the LED, the space charge is actively recovered and stored, thereby significantly reducing the duration of the fall time. The recovered energy is reapplied to the LED during the next subsequent rise time, thereby adding to the efficiency of the overall circuit. The reduced rise time and fall time enables the LED to operate at higher frequencies than would ordinarily be possible.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF VARIOUS ILLUSTRATIVE EMBODIMENTS

Although the present invention resonant impedance transforming network can be used in any application where it is desired to drive an infrared LED in a power efficient manner, the present invention is especially well suited for use in portable infrared communication devices that operate on low power commercial batteries. Accordingly, the present invention resonant impedance transforming network will be herein described as part of a battery operated portable infrared communication device in order to set forth the best mode contemplated for the invention.

Figure 1:
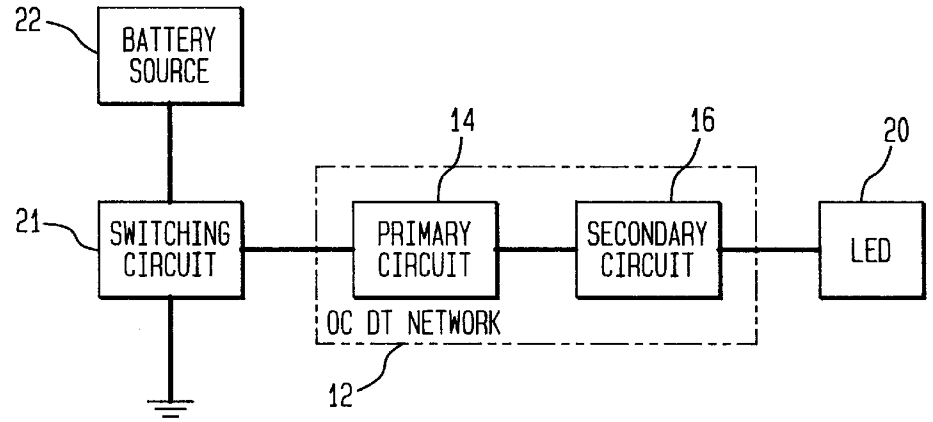
FIG. 1 is a general schematic of one preferred embodiment of a resonant impedance transforming network in accordance with the present invention.

Referring to FIG. 1, the general architecture of the present invention resonant impedance transforming network 10 is shown. In the shown embodiment, an over coupled double tuned network with inductive coupling (OCDT Network) 12 is provided, wherein the OCDT Network 12 includes a primary circuit 14 and a secondary circuit 16. As will later be shown, both the primary circuit 14 and the secondary circuit 16 contain windings that are arranged so that mutual inductance exists between the windings. The effect of the mutual inductance is to make possible the transfer of energy from one circuit to the other by transformer action. As a result, an alternating current flowing in the primary circuit 14 produces magnetic flux which induces a voltage in the secondary circuit 16 and vice versa. This results in induced currents and a transfer of energy between the primary circuit 14 and the secondary circuit 16.

The primary circuit 14 is coupled to a battery supply 22 via a switching circuit 21. The switching circuit 21, as will later be explained, switches between the battery supply 22 and ground at the exact moment where there is no current flow in the primary circuit 14.

An LED 20 is included in the secondary circuit 16. The purpose of the resonant impedance transforming network 10 is to provide a high initial current to the LED 20 when it is turned “on”. The higher initial current shortens the rise time of the LED 20 to a lower time value. The resonant impedance transforming network 10 also has an active turn off function. Due to the use of the OCDT Network 12, when the LED 20 is turned “off”, energy stored in the excess minority carriers of the LED 20 is recovered in a reversible way. The recovered energy is stored and is then reapplied to the LED 20 the next time the LED 20 is turned “on”. The active turn off function actively drains charge from the LED 20 and shortens the fall time of the LED 20, thereby enabling the LED to operate at higher frequencies. Furthermore, the recovered energy adds to the overall efficiency of the resonant network drive.

Figure 2:
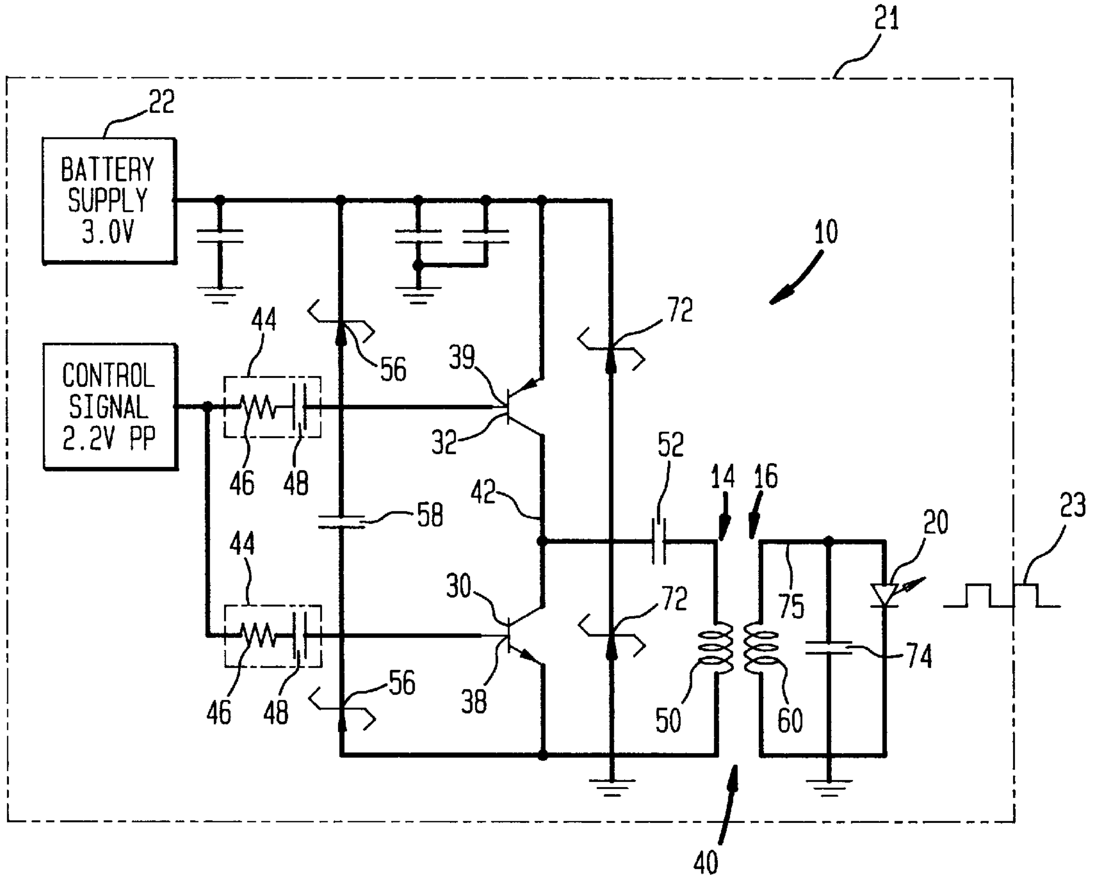
FIG. 2 is a more detailed schematic of the exemplary embodiment of FIG. 1.

Referring to FIG. 2, a more detailed schematic of an exemplary embodiment of the resonant impedance transforming network 10 is provided. In the shown exemplary embodiment, the resonant impedance transforming network 10 is part of a portable infrared communication device 21, such as a television remote control unit or a cordless headset, that transmits an infrared signal 23 to a remote receiver.

In the shown embodiment, the resonant impedance transforming network 10 contains an inductively coupled circuit having a primary circuit 14 and a secondary circuit 16 that may or may not be tuned to the same frequency. The purpose of the resonant impedance transforming network 10 is to efficiently drive an infrared LED 20, that is contained in the secondary circuit 16, from a low voltage battery supply 22, that is coupled to the primary circuit 14. In the preferred embodiment, the battery supply 22 contains two commercially available 1.5 volt batteries joined in series, thereby supplying 3.0 volts to the resonant impedance transforming network 10. As will be explained, the resonant impedance transforming network 10 drives the infrared LED 20 with a drive efficiency of over eighty five percent. The combined high efficiency of the resonant impedance transforming network 10 and the LED 20 enables the portable infrared communications device 21 to operate for more than one hundred hours on the power supplied by two AA sized batteries.

A key element to the overall efficiency of the resonant impedance transforming network 10 is the DC power-to-light conversion efficiency of the infrared LED 20. In the preferred embodiment of the present invention, the infrared LED 20 is GaAlAs based. An example of a suitable GaAlAs infrared LED is the Model OD-880 high power GaAlAs IR emitter, manufactured by Opto Diode Corporation of Newbury Park, Calif. The Model OD-880 GaAlAs IR emitter contains a TO-46 gold plated header surrounded by a 42 mil high ring. The surface of the GaAlAs chip is disposed a few mils below the ring on the header. An epoxy dome is provided that serves as an immersion lens. The epoxy dome contacts the surface of the GaAlAs chip providing some degree of index matching. Because of the index matching provided by the epoxy dome, the efficiency of the GaAlAs chip is much higher than it would be if left bare. The infrared LED 20 selected has a peak DC power-to-light conversion efficiency of approximately 26.5 percent.

Although GaAlAs based infrared LEDs are typically more efficient than traditional LEDs, GaAlAs LEDs often cannot be readily substituted for traditional LEDs in a given application without changing the LED drive circuitry. The reason GaAlAs LEDs commonly cannot be directly substituted is that GaAlAs LEDs tend to have long rise and fall times that prevent them from operating at higher frequencies. Traditional low efficiency LEDs have rise and fall times that are typically in the range of thirty nanoseconds. However, such rapid low efficiency LEDs only have a DC power-to-light conversion efficiency of typically less than ten percent. In the resonant impedance transforming network 10 shown, the GaAlAs based LED 20 has a peak DC power-to-light efficiency of 26.5 percent. However, the rise and fall times of the GaAlAs LED 20 are in the range of 0.5 microseconds, which is too slow for many data transmission applications.

The resonant impedance transforming network 10 is designed to shorten the rise and fall times of the high efficiency GaAlAs based LED 20. As will be explained, the resonant impedance transforming network 10 provides a high initial current to the LED 20 when it is turned "on". The higher initial current shortens the rise time of the LED 20 to a lower time value. The resonant impedance transforming network 10 also has an active turn off function, wherein as the LED 20 is turned "off", energy stored in the excess minority carriers of the LED 20 is recovered in a reversible way. The recovered energy is then reapplied to the LED 20 the next time the LED 20 is turned "on". The active turn off function actively drains charge from the LED 20 and shortens the fall time of the LED 20, thereby enabling the LED to operate at higher frequencies. Furthermore, the recovered energy adds to the overall efficiency of the resonant impedance transforming network 10.

In the embodiment of the resonant impedance transforming network 10 shown in FIG. 2, it can be seen that a inductively coupled circuit is provided that includes a primary winding 50 and a secondary winding 60. The primary winding 50 is part of the primary circuit 14 and the secondary winding 60 is part of the secondary circuit 16. The primary circuit 14 also contains two bipolar transistors 30, 32 which control the flow of current though a primary winding 50. The selected operational frequency of the resonant impedance transforming network 10 is preferably 400 KHz for the shown embodiment. The bipolar transistors 30, 32 are oppositely doped, therefore containing an NPN bipolar transistor 30 and a PNP bipolar transistor 32. Examples of suitable bipolar transistors would be an MPSA06 transistor for the NPN bipolar transistor 30 and an MPSA56 transistor for the PNP bipolar transistor 32. As will later be explained, MOSFETs can be substituted for the bipolar transistors 30, 32 shown. The MOSFETs selected preferably have a combined capacitance of under 200 pF which enable a drive efficiency of over ninety percent at 400 KHz and 3.0 volts. Since the battery source is 3.0 volts, it will be understood that the selected MOSFETs must also have a gate threshold voltage of below 3.0 volts. Examples of such MOSFET transistors are the TP0201T and TP0202T MOSFETS manufactured by Siliconix.

In the preferred embodiment of FIG. 2, it can be seen that each of the bases 38, 39 of the two bipolar transistors 30, 32 is coupled in series to a time constant circuit 44. Each time constant circuit 44 includes a series combination resistor 46 and capacitor 48 that ensure a high current supply to the corresponding bipolar transistor 30, 32 at the off-to-on transition. In the exemplary embodiment shown, each resistor 46 has a value of 511 ohms and each capacitor 48 has a value of 470 pF. The drive current produced by each time constant circuit 44 decreases with time to essentially zero. As a result, the bipolar transistors 30, 32 are barely saturated at the turn off transition. This increases the turn off speed of each of the bipolar transistors 30, 32 because there is less stored charge available.

The collectors leads of the two bipolar transistors 30, 32 are joined in series by a lead 42. A capacitor 52 is coupled to the serial lead 42 between the collector leads of the bipolar transistors 30, 32, wherein the capacitor 52 leads to the first end of the primary winding 50 within the transformer 40. As will later be explained, the value of the capacitor 52 is used in determining the frequency of the primary winding 50 in relation to the frequency of the secondary winding 60. For the values later given for the inductances of the primary winding 50 and secondary winding 60, the value of capacitor 52 is selected to be 0.1 $\mu$F.

While the emitter of the PNP bipolar transistor 32 is coupled to the 3 V supply voltage, the emitter of the NPN bipolar transistor 30 is coupled to the second end of the primary winding 50, opposite the capacitor 52. The second end of the primary winding 50 and the emitter of the NPN bipolar transistor 30 are coupled to ground. However, second end of the primary winding 50 and the emitter of the NPN bipolar transistor 30 are also coupled to the negative side of the three volt battery supply 22. Two Schottky diodes 56 and a capacitor 58 are disposed between the base and emitter of transistors 30 and 32. In the exemplary embodiment of the resonant impedance transforming network 10, the capacitor 58 is disposed between the two bases of transistors 30 and 32 and has a value of approximately 100 pF.

The capacitor 58 helps eliminates current shoot through from the three volt battery supply 22 when the two bipolar transistors 30, 32 might otherwise be "on". The capacitor 58 also increases the initial drive current, thereby helping to switch off the bipolar transistors 30, 32.

In the secondary circuit 16, the anode of the GaAlAs LED 20 is coupled to the first end of a secondary winding 60 contained within the transformer 40. A capacitor 74, used to tune the secondary circuit 16, is coupled to ground and to a lead 75 between the first end of the secondary winding 60 and the anode of the LED 20.

In the inductively coupled circuit of the shown embodiment, the primary winding 50 contains eighty turns of 30/48 spsn Litz wire, while the secondary winding 60 contains only forty turns of the same wire on a separate bobbin. As a result, the inductively coupled circuit has a two to one step down winding ratio. However, the coefficient (K) of the coupling is reduced to 0.864 instead of one to one. As such, only 86.4% of the flux generated by the primary winding 50 is linked to the secondary winding 60 which is also true for the flux generated by the secondary winding 60 as coupled to the primary winding 50. For the exemplary windings described, the inductance of the primary winding 50 is 0.739 mH, while the inductance of the secondary winding 60 is 0.1557 mH. The windings described produce a transformer 40 with an effective Q of 382 and a true Q of 395.

In the embodiment of FIG. 2, the capacitor 52 coupled to the primary winding 50 and the capacitor 74 coupled to the secondary winding 60 produce an over coupled double tuned circuit. As is known in the art, when one has an over coupled double tuned circuit with the primary and secondary circuits tuned to the same frequency, a double peaked response occurs with one response above and one response below the frequency. To operate at a maximum, the tuned primary and secondary circuits have to be either tuned above or below the maximum in question. The tuning conditions which yield a maximum are governed by the following equation:

$$\left(1-\frac{f_2^2}{f^2}\right)\left(1-\frac{f_1^2}{f^2}\right)=K^2$$

where f is the operating frequency and $f_1$ and $f_2$ are the respective resonant frequencies of the primary circuit 14 and the secondary circuit 16.

In some applications, the power output of the transformer 40 may have to be altered. For the embodiment shown, one simple way to increase the drive power is to decrease the value of the capacitor 52 in the primary circuit 14 and increase the value of the capacitor 74 in the secondary circuit 16. A two to one change in power level by this method only decreases efficiency slightly. As the value of the capacitor 52 in the primary circuit 14 decreases, there is a step up in voltage at the primary winding 50 and the waveform produced tends towards a triangular shape. Because of the higher waveform voltage at the primary winding 50, additional energy is dissipated in the distributed capacity of the primary winding 50. The power output level can also be lowered by placing an inductor in series with the primary winding 50 and decreasing the value of the capacitor 74 in the secondary circuit 16. Alternatively, the power output level can also be altered by changing the turns ratio in the transformer 40.

Figure 3:
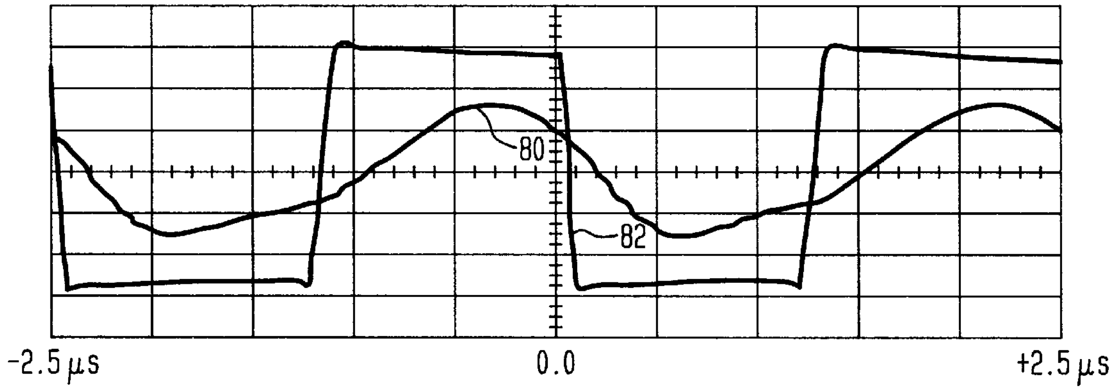
FIG. 3 is a graphical representation of an oscilloscope display illustrating a current waveform and a voltage waveform that occur across the primary winding of the transformer contained within the resonant inductance transforming network of FIG. 2 at an operating frequency of 400 KHZ, each of the vertical divisions illustrated represent a 500 mV change for the voltage waveform and a 5 ma change for the current waveform.

Referring to FIG. 3 in conjunction with FIG. 2, the operational behavior of the primary circuit 14 can be partially explained. FIG. 3 shows a current waveform 80 at 400 KHz and a voltage waveform 82 at 400 KHz that occur across the primary winding 50.

As can be seen, at 400 KHz there is close to zero current switching and there is no real overshoot in the voltage waveform 82. The primary losses in the shown mode of operation are due to the finite voltage drop of both bipolar transistors 30, 32 when the bipolar transistors 30, 32 are turned "on" and the resulting non zero impedance is experienced by the primary winding 50, especially during the turn off-turn on period. The value of the Q of the secondary winding 60 with the primary winding 50 open is about 250. When the secondary winding 60 is shorted, its Q value drops to about 75 due to the loading of the primary winding 50. If the primary winding 50 now experiences an additional series resistance, the effective Q value of the circuit drops even more. As a result, it is important to have the primary winding 50 experience the lowest switch resistance and have the transition period as short as possible. The magnitude of the current in the primary winding 50 is about one third that of the secondary winding 60 due to the impedance transformation of the transformer 40.

Figure 4:
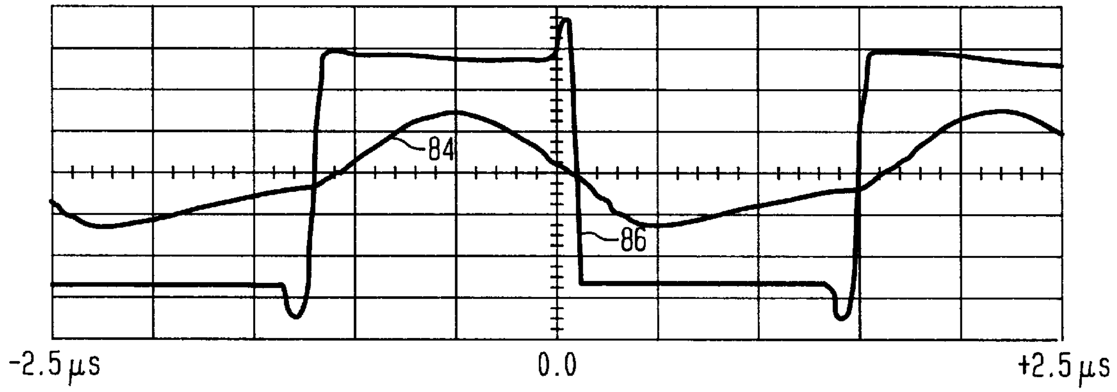
FIG. 4 is a graphical representation of an oscilloscope display illustrating a current waveform and a voltage waveform that occur across the primary winding of the transformer contained within the resonant impedance transforming network of FIG. 2 at an operating frequency of 370 KHz, each of the vertical divisions illustrated represent a 500 mV change for the voltage waveform and a 5 mA change for the current waveform.

Referring to FIG. 4 in conjunction with FIG. 2, the behavior of the primary circuit 14 is shown at a switching frequency of 370 KHz, which is 30 KHz below the desired impressed frequency of 400 KHz. FIG. 4 shows a current waveform 84 at 370 KHz and a voltage waveform 86 at 370 KHz that occur at the primary winding 50. For the overshoot waveforms in FIG. 4, the bipolar transistors 30, 32 are both off, and the current in the primary winding 50 is such to make the voltage rise above the supply voltage until one of the bipolar transistor 30, 32 turns on. During this time the Schottky diodes 56 conduct and dissipate power due to the current flowing and the finite voltage drop of the Schottky diodes 56. To decrease the loss created by the Schottky diodes 56 a shorter turn off-turn on time is desired so that the primary winding 50 experiences a low impedance at either ground or the supply potential more of the time.

Figure 5:
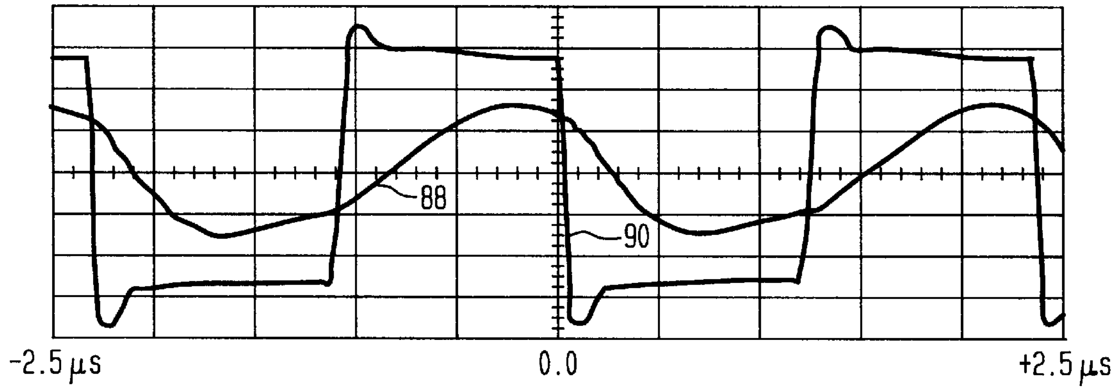
FIG. 5 is a graphical representation of an oscilloscope display illustrating a current waveform and a voltage waveform that occur across the primary winding of the transformer contained within the resonant impedance transforming network of FIG. 2 at an operating frequency of 430 KHz, each of the vertical divisions illustrated represent a 500 mV change for the voltage waveform and a 5 mA change for the current waveform.

Referring to FIG. 5 in conjunction with FIG. 2, the behavior of the primary circuit 14 is shown at a switching frequency of 430 KHz, which is 30 KHz above the desired impressed frequency of 400 KHz. FIG. 5 shows a current waveform 88 at 430 KHz and a voltage waveform 90 at 430 KHz that occur at the primary winding 50. In FIG. 5 it can be seen that the current at the transition is such as to make the voltage go to the other potential and beyond before the respective bipolar transistor is even turned on. Again the Schottky diodes 56 conduct and dissipate power. As the frequency is increased, the time that the Schottky diodes 56 conduct becomes longer and longer even though the bipolar transistors 30, 32 are on.

From FIGS. 3, 4 and 5 a fundamental difference can be understood between the way the shown bipolar transistors 30, 32 work as opposed to the way alternate embodiment MOSFETs would work. The way bipolar transistors 30, 32 work and the way MOSFET devices work makes a difference in the efficiency of the circuit. In the case of bipolar transistors 30, 32, once the collector voltage has gone beyond saturation towards forward bias of the base-collector diode, a bipolar transistor cannot pull the voltage back. In fact, the base is pulled down depending on the source impedance of the base drive. So the Schottky diodes 56 are required to improve the efficiency in this mode of operation. MOSFET devices are much better at the higher frequency because the $R_{ds}$ associated with a MOSFET device stay low even when the voltage reverses. In such a case, the only time that the Schottky diodes are really helpful occurs at times when both MOSFETs are off or partially off.

Figure 6:
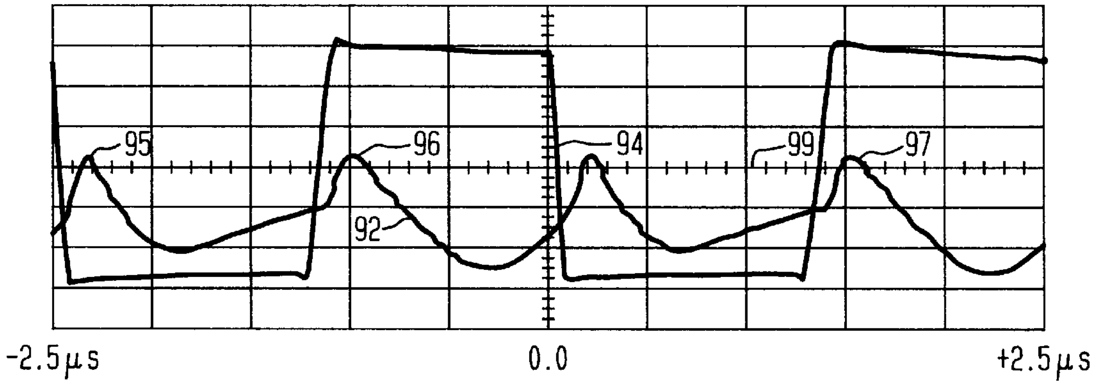
FIG. 6 is a graphical representation of an oscilloscope display illustrating a power flow that occurs across the primary winding of the transformer contained within the resonant impedance transforming network of FIG. 2 at an operating frequency of 400 KHz, each of the vertical divisions illustrated represent a 500 mV change for the primary voltage waveform and a 5 mW change for the primary power waveform.

FIG. 6 shows the power flow in the primary winding 50 at 400 KHz. FIG. 6 contains a power waveform 92 at 400 KHz and a voltage waveform 94 at 400 KHz that occur across the primary winding 50. As can be seen, power flows into the primary winding 50 when either bipolar transistor 30, 32 is on. The two different peak configurations 95, 96 contained within the power waveform 92, correspond to the turning on of the NPN bipolar transistor 30 and PNP bipolar transistor 32, respectively. The little bumps of power 97 above the zero line 99 is power flowing out of the primary winding 50 during switch transition that is dissipated in the collector impedance and the Schottky diodes 56. At the optimum frequency of about 385 KHz, these become very small while they become larger at higher and lower frequencies.

Figure 7:
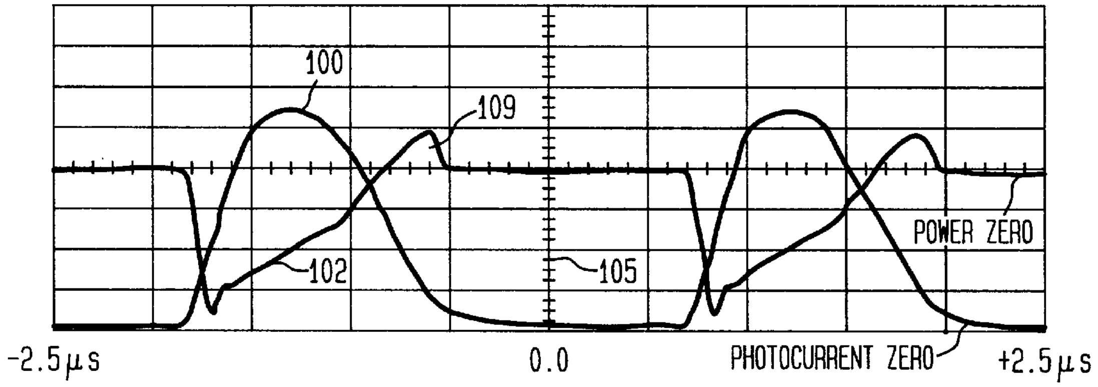
FIG. 7 is a graphical representation of an oscilloscope display illustrating a photocurrent waveform and a power waveform that occur across the primary winding of the transformer contained within the resonant impedance transforming network of FIG. 2, each of the vertical divisions illustrated represent a 50 FA change for the photocurrent waveform and a 10 mW change for the power waveform.

Referring to the secondary circuit 16 in FIG. 2, it can be seen that in operation, the capacitor 74 in the secondary circuit 16 is used to store power. The secondary winding 60 charges the capacitor 74, wherein the capacitor 74 becomes charged to a higher voltage than the normal operating voltage for the LED 20. This is due to conductivity modulation wherein the initial LED voltage is higher than the normal operating voltage. The result is that when the LED 20 starts to conduct in its normal fashion, current continues to flow from the secondary winding 60 at the same value but now into the LED 20. At the same time, the capacitor 74 also discharges providing additional current limited by the roughly four ohm dynamic impedance of the LED 20. This contributes to a higher current for turning the LED 20 on, thereby decreasing the photocurrent rise time. This effect will be seen in plots of the actual circuit operation. FIG. 7 shows a photocurrent waveform 100 and a power waveform 102 for the LED 20 when the primary circuit 14 is operating at 3.0 volts @ 400 KHz. In FIG. 7, the center axis 105 of time corresponds to the activation of the NPN bipolar transistor 30. Referring to FIG. 7 in conjunction with FIG. 2, it can be seen that a hump 109 occurs in the power waveform 102 due to the discharge of the capacitor 74 in the secondary circuit 16 when the LED voltage overshoots, thereby decreasing the rise time of the LED 20. The bipolar NPN transistor 30 is on until the change in power slope which corresponds to the time when the bipolar PNP transistor 32 turns on.

Figure 8:
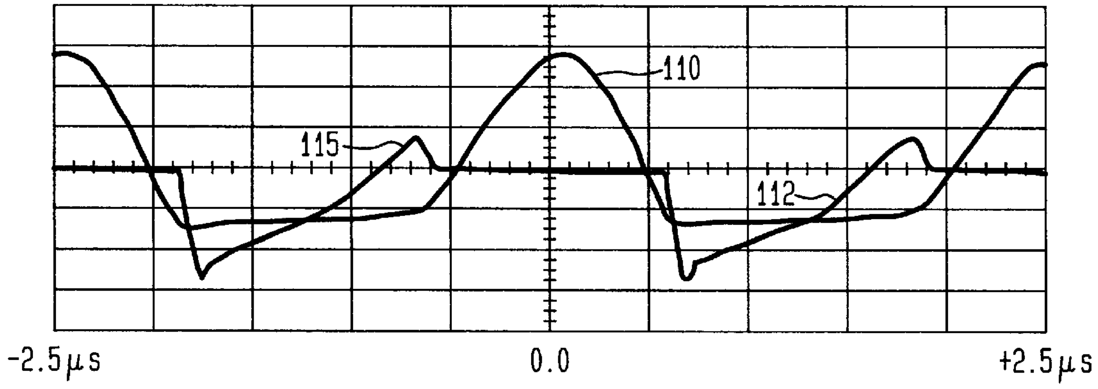
FIG. 8 is graphical representation of an oscilloscope display illustrating a voltage waveform and a current waveform flowing into and out of the LED contained within the resonant impedance transforming network of FIG. 2, each of the vertical divisions illustrated represents a 1 volt change for the voltage waveform and a 10 mW change for the current waveform.
Figure 9:
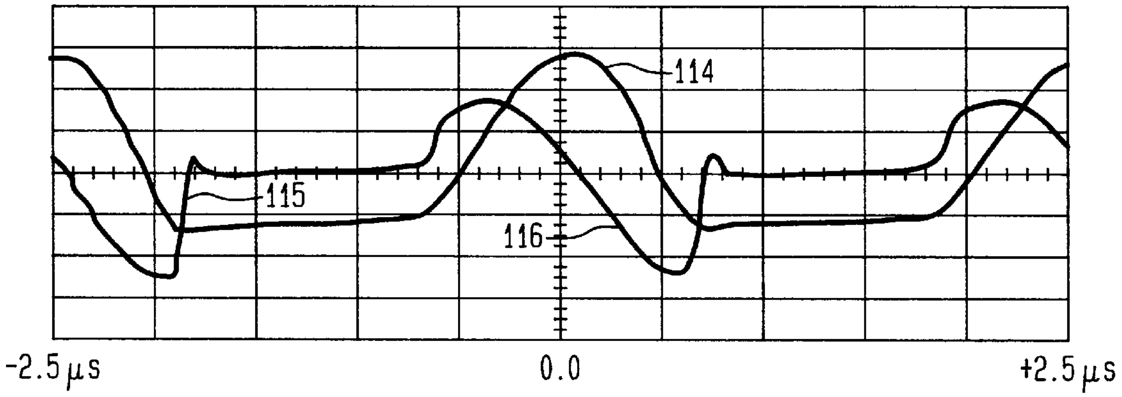
FIG. 9 is graphical representation of an oscilloscope display illustrating a voltage waveform and a current waveform flowing into and out of the capacitor in the secondary circuit contained within the resonant impedance transforming network of FIG. 2, each of the vertical divisions illustrated represents a 1 volt change for the voltage waveform and a 10 mW change for the current waveform.

FIG. 8 shows the voltage waveform 10 across the LED 20 and the current waveform 112 illustrating current first flowing into and then out of the LED 20. A negative current represents current flowing into the LED 20 in the forward direction. A positive current represents current flowing out of the LED 20 even though the voltage of the LED 20 may be still in the forward direction. The voltage waveform 110 clearly shows the duty cycle difference which is consistent with the lowering of the resonant frequency. It can also be seen that on current time is much shorter than the voltage. FIG. 9 shows a voltage waveform 114 and a current waveform 115 representing the voltage and current flowing in the capacitor 74 (FIG. 2) of the secondary circuit 16. Since the secondary winding 60, capacitor 74 and the LED 20 (all in FIG. 2) are in parallel the voltage waveforms are identical. The combined current flows of FIG. 8 and FIG. 9 will be seen to be continuous with one current falling off while the other builds up. In FIG. 8, the small current hump 115 at the turn on of the LED 20 can be seen as the equivalent to the current hump 116 in FIG. 9 flowing out of the capacitor 74.

Figure 10:
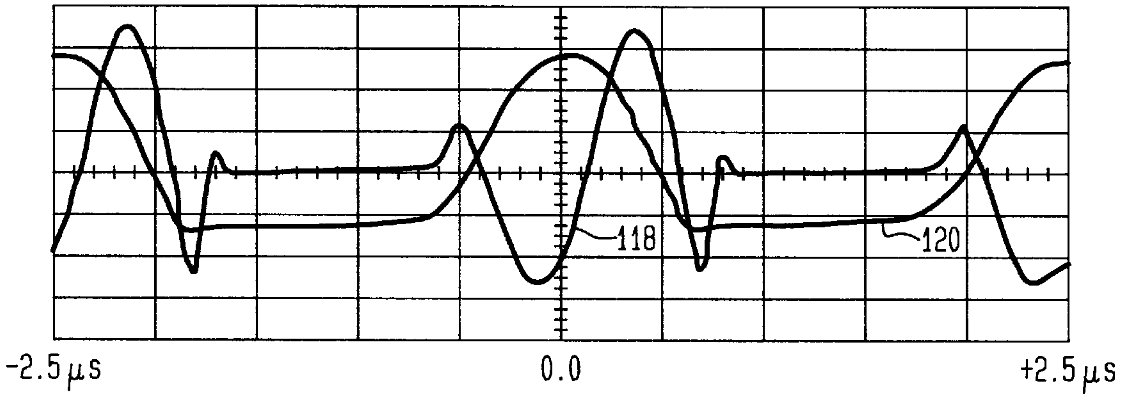
FIG. 10 is graphical representation of an oscilloscope display illustrating a voltage waveform and a power waveform flowing into and out of the capacitor in the secondary circuit contained within the resonant impedance transforming network of FIG. 2, each of the vertical divisions illustrated represents a 1 volt change for the voltage waveform and a 10 mW change for the power waveform.
Figure 11:
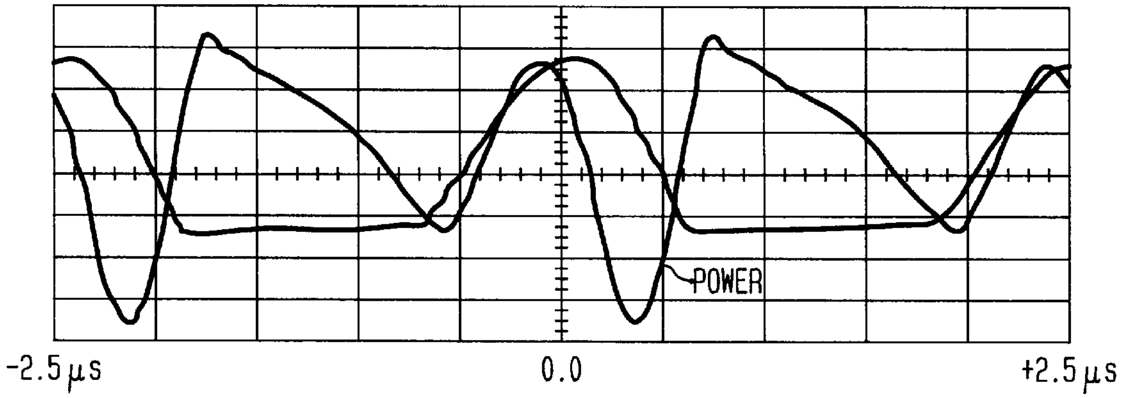
FIG. 11 and FIG. 12 are graphical representations of oscilloscope displays illustrating the sum of the voltage waveforms and power waveforms of FIGS. 7 and 10 flowing into and out of the secondary winding contained within the resonant impedance transforming network of FIG. 2, each of the vertical divisions illustrated represents a 1 volt change for the voltage waveform and a 10 mW change for the power waveform.
Figure 12:
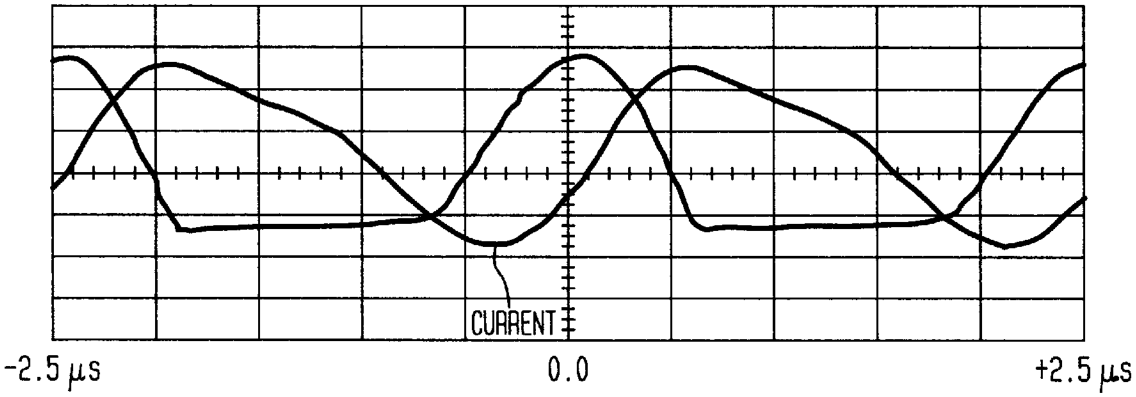

The power flow in and out of the capacitor 74 of the secondary circuit 16 is shown in FIG. 10, which sets forth the resulting power waveform 118 and voltage waveform 120. The power flow in and out of the capacitor 74 (FIG. 2) shown in FIG. 10 is continuous when combined with the power flow in FIG. 7. The sum of the currents and powers from FIG. 10 and FIG. 7 are set forth in FIG. 11 and FIG. 12. FIG. 11 and FIG. 12 show the power and current for the secondary winding 60 (FIG. 2). As can be seen, the power and current flowing out of the secondary winding 60 match the same quantities flowing into the LED 20 except for the hump provided by capacitor 74. The current flowing in the secondary winding 60 is fairly smooth with its duty cycle also longer when the LED 20 is on. From the above, it can be understood that the capacitor provides a spike in the current that supplements the current from the secondary winding 60 when the LED 20 is turned on. This results in a much more rapid rise time for the LED 20 which allows the LED 20 operate at higher frequencies than would ordinarily be permissible. Furthermore, when the LED 20 is switched off, energy stored in the space charge of the LED 20 and the capacitance of the secondary circuit 16 is available for adiabatic or reversible recovery. The adiabatic recovery of the stored energy decreases the fall time associated with the LED 20 and reduces the size of the light waveform tail. As such, the LED 20 has a much reduced fall time that also enables the LED 20 to operate at higher efficiencies than would ordinarily be possible.

For the preferred embodiment of the resonant impedance transforming network 10 described, operating at 400 KHz and with a three volt supply, the resonant impedance transforming network 10 yields 8.2 milliwatts of DC input power. The resonant impedance transforming network 10, without recovery, produces a drive efficiency for the LED 20 of over 85%, and a light output which is 82.5% of the light that the LED 20 would produce if it could be run at its highest DC efficiency with the same input power. The conversion efficiency of turning DC power into light at 400 KHz is approximately 22% or 1.8 milliwatts of light for 8.2 milliwatts of DC input power.

A little over ten percent of the "on" energy of the LED 20 is recovered during the turn off cycle. The recovered energy amounts to approximately two nanojoules per cycle. The recovered energy reduces drive power needs by 0.8 milliwatts. Accounting for the recovery of the energy recovered from the LED 20, at 15 mW average LED drive power, 99.2% of the peak DC efficiency is achievable at 400 KHz.

Figure 13:
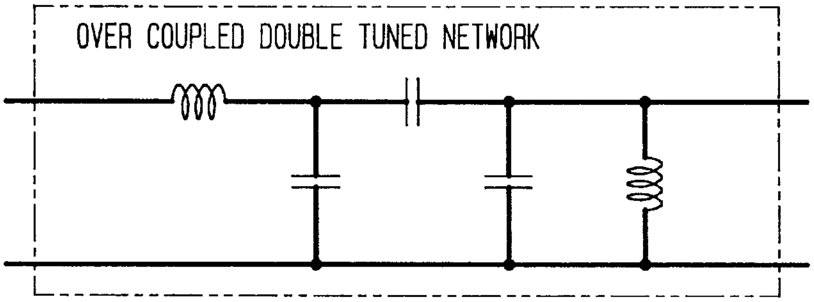
FIG. 13 is another embodiment of an over coupled double tuned network used in the present invention.

Although the present invention is particularly well suited for use with an over coupled double tuned circuit with inductive coupling, and has been described with respect to this application, the methods and apparatus disclosed here are equally well suited for networks other than a transformer based network where looking into the network an inductance is seen and not a capacitance to ground. Referring to FIG. 13 there is shown a schematic diagram of one such network embodiment which is not based upon a transformer which is equally well suited.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed is:

1. A drive circuit comprising:

an LED having a predetermined rise time at a given operational current and voltage;

an inductively coupled circuit having a primary winding and a secondary winding, wherein said primary winding induces said operational current and voltage in said secondary winding;

charge storage means, coupled to said secondary winding and said LED, for storing a charge in excess of said operational voltage, said charge storage means discharging said charge to said LED when said LED begins to conduct, wherein said charge combines with said operational current from said secondary winding to provide said LED with an activation current that is momentarily greater than said operational current, thereby reducing said rise time of said LED.

2. The drive circuit according to claim 1, wherein said charge storage means includes at least one capacitor.

3. The drive circuit according to claim 2, wherein said LED contains a space charge while conducting and said drive circuit further includes a recovery means for recovering at least part of said space charge when said LED stops conducting.

4. The drive circuit according to claim 1, further including a battery supply coupled to said primary winding, thereby providing current to said primary winding.

5. The drive circuit according to claim 4, further including switching means for switching the flow of current through said primary winding at a predetermined frequency.

6. The drive circuit according to claim 5, wherein said switching means includes at least one transistor selected from a group consisting of bipolar transistors and MOSFETs.

7. The drive circuit according to claim 4 wherein said battery supply is a three volt supply.

8. The drive circuit according to claim 4 wherein said predetermined frequency is approximately 400 KHz.

9. The drive circuit according to claim 1, wherein said LED is GaAlAs based.

10. A drive circuit comprising:

an LED having a predetermined space charge when conditioned in an on state;

a power supply circuit for supplying power to said LED;

switching means for selectively switching said LED between said on state and an off state;

recovery means for recovering and storing at least part of said space charge when said LED is changed from said on state to said off state by said switching means, wherein said at least part of said space charge recovered is reapplied to said LED when said switching means switches said LED from said off state to said on state.

11. The drive circuit according to claim 10, wherein said power supply circuit includes an inductively coupled circuit containing a primary winding and a secondary winding, wherein said LED is coupled to said secondary winding.

12. The drive circuit according to claim 11, further including at least one capacitor coupled to said secondary winding and said LED, wherein said at least one capacitor stores a charge that is applied to said LED when said switching means switches said LED from said off state to said on state.

13. The drive circuit according to claim 11, wherein said switching means includes at least one transistor disposed between said primary winding and said power supply.

14. The drive circuit according to claim 10, wherein said LED has a predetermined rise time when switched from said off state to said on state, and said drive circuit further includes a means for decreasing said rise time by momentarily supplying an increased current to said LED when said LED is switched from said off state to said on state.

15. The drive circuit according to claim 10 wherein said power supply circuit includes a three volt DC source.

16. The drive circuit according to claim 13, wherein said at least one transistor selected from a group consisting of bipolar transistors and MOSFETs.

17. The drive circuit according to claim 10, wherein said LED is GaAlAs based.

18. A method decreasing the rise time and fall time associated with an LED coupled to a power source, comprising the steps of:

providing at least one capacitor coupled to both said power source and said LED, wherein said at least one capacitor is charged by said power source;

discharging said at least one capacitor to provide a charge to said LED in addition to said power source, thereby momentarily providing an elevated current to said LED that reduces the rise time associated with said LED.

19. The method according to claim 18, wherein said LED retains a space charge while in an on condition between said rise time and said fall time, and said method further includes the step of recovering at least some of said space charge from said LED during said fall time, thereby reducing said fall time.

20. The method according to claim 19, further including the step of reapplying said at least some of said space charge recovered from said LED during a fall time at a next subsequent rise time.

* * * * *